(12) United States Patent
Allemand

(10) Patent No.: US 9,440,291 B2
(45) Date of Patent: Sep. 13, 2016

(54) METHODS OF CONTROLLING NANOSTRUCTURE FORMATIONS AND SHAPES

(71) Applicant: CHAMP GREAT INT'L CORPORATION, Eden Island (SC)

(72) Inventor: Pierre-Marc Allemand, San Jose, CA (US)

(73) Assignee: Champ Great Int'l Corporation, Eden Island (SC)

(*) Notice: Subject to any disclaimer, the term of this patent is extended or adjusted under 35 U.S.C. 154(b) by 0 days.

(21) Appl. No.: 14/247,689

(22) Filed: Apr. 8, 2014

(65) Prior Publication Data

US 2014/0216207 A1    Aug. 7, 2014

Related U.S. Application Data

(60) Continuation of application No. 13/040,549, filed on Mar. 4, 2011, now Pat. No. 8,709,125, which is a division of application No. 11/766,552, filed on Jun. 21, 2007, now Pat. No. 8,454,721.

(60) Provisional application No. 60/815,627, filed on Jun. 21, 2006.

(51) Int. Cl.
*B22F 9/24* (2006.01)
*C30B 7/14* (2006.01)
*C30B 29/60* (2006.01)

(52) U.S. Cl.
CPC . *B22F 9/24* (2013.01); *C30B 7/14* (2013.01); *C30B 29/60* (2013.01); *B22F 2998/00* (2013.01); *B22F 2999/00* (2013.01)

(58) Field of Classification Search
CPC ........ B82Y 30/00; B22F 1/0025; B22F 9/24; C30B 29/60
USPC ........................................................... 75/370
See application file for complete search history.

(56) References Cited

U.S. PATENT DOCUMENTS

| | | |
|---|---|---|
| 3,167,429 A | 1/1965 | Levy |
| 3,552,969 A | 1/1971 | Henn et al. |
| 4,486,350 A | 12/1984 | Bauer et al. |
| 4,539,041 A | 9/1985 | Figlarz et al. |
| 5,565,143 A | 10/1996 | Chan |
| 6,221,222 B1 | 4/2001 | Kipp et al. |

(Continued)

FOREIGN PATENT DOCUMENTS

| | | |
|---|---|---|
| EP | 1 623 954 A1 | 2/2006 |
| JP | 2008-190006 A | 8/2008 |
| WO | 2009/017852 A2 | 2/2009 |

OTHER PUBLICATIONS

Advanced Nano Products, "Nano silver ink for ink jet printing," retrieved Jun. 2, 2009, from http://www.anapro.com/english/product/nano_silver.asp, 2 pages.

(Continued)

*Primary Examiner* — Weiping Zhu
(74) *Attorney, Agent, or Firm* — Cooper Legal Group, LLC

(57) ABSTRACT

A method of forming monodispersed metal nanowires comprising: forming a reaction mixture including a metal salt, a capping agent and an ionic additive in a polar solvent at a first temperature; and forming metal nanowires by reducing the metal salt in the reaction mixture.

16 Claims, 6 Drawing Sheets

(56) References Cited

U.S. PATENT DOCUMENTS

| | | | |
|---|---|---|---|
| 6,597,947 | B1 | 7/2003 | Inoue et al. |
| 7,048,806 | B2 | 5/2006 | Ochomogo et al. |
| 8,269,214 | B2 | 9/2012 | Smigelski, Jr. et al. |
| 2005/0056118 | A1* | 3/2005 | Xia .................. B22F 1/0007 75/330 |
| 2007/0034052 | A1 | 2/2007 | Vanheusden et al. |
| 2007/0074316 | A1 | 3/2007 | Alden et al. |
| 2007/0160647 | A1 | 7/2007 | Pritchard et al. |
| 2008/0003130 | A1 | 1/2008 | Xia et al. |
| 2008/0038521 | A1* | 2/2008 | Robbins .................. C30B 25/04 42/209 |
| 2008/0143906 | A1 | 6/2008 | Allemand et al. |
| 2008/0210052 | A1 | 9/2008 | Allemand |
| 2008/0229612 | A1 | 9/2008 | Sommer et al. |
| 2008/0259262 | A1 | 10/2008 | Jones et al. |
| 2009/0052029 | A1 | 2/2009 | Dai et al. |
| 2009/0098405 | A1 | 4/2009 | Matsunami |
| 2009/0130433 | A1 | 5/2009 | Takada |
| 2009/0196788 | A1 | 8/2009 | Wang et al. |
| 2009/0228131 | A1 | 9/2009 | Wolk et al. |
| 2009/0242231 | A1 | 10/2009 | Miyagisima et al. |
| 2009/0321113 | A1 | 12/2009 | Allemand et al. |
| 2010/0034693 | A1 | 2/2010 | Li |
| 2010/0307792 | A1 | 12/2010 | Allemand et al. |
| 2011/0024159 | A1 | 2/2011 | Allemand et al. |

OTHER PUBLICATIONS

Chen et al., "The influence of seeding conditions and shielding gas atmosphere on the synthesis of silver nanowires through the polyol process," *Nanotechnology* 17:466-474, 2006.

Ducamp-Sanguesa et al., "Synthesis and Characterization of Fine and Monodisperse Silver Particles of Uniform Shape," *Journal of Solid State Chemistry* 100:272-280, 1992.

Filankembo et al., "Is the Anion the Major Parameter in the Shape Control of Nanocrystals?," *J. Phys. Chem. B* 107(30):7492-7500, 2003.

International Search Report, dated Aug. 10, 2010, for International Application No. PCT/US2010/033618, 14 pages.

Jana et al., "Wet Chemical Synthesis of Silver Nanorods and Nanowires of Controllable Aspect Ratio," *Chem. Commun.* 617-618, 2001.

Kim et al., "Platonic Gold Nanocrystals," *Angew. Chem.* 116:3759-3763, 2004.

Nikoobakht et al., "Preparation and Growth Mechanism of Gold Nanorods (NRs) Using Seed-Mediated Growth Method," *Chem. Mater* 15(10):1957-1962, 2003.

Okada et al., "Development of Fine Circuit Pattern Formation Process Using Nano-metal Ink," *SEI Technical Review* 62:54-57, Jun. 2006.

Silvert et al., "Preparation of colloidal silver dispersions by the polyol process. Part I—Synthesis and characterization," *J. Mater. Chem.* 6(4):573-577, 1996.

Silvert et al., "Preparation of colloidal silver dispersions by the polyol process. Part I—Synthesis and characterization," *J. Mater. Chem.* 7(2):293-299, 1997.

Sun et al., "Crystalline Silver Nanowires by Soft Solution Processing," *Nano Letters* 2(2):165-168, 2002.

Sun et al., "Shape-Controlled Synthesis of Gold and Silver Nanoparticles," *Science* 298:2176-2179, Dec. 13, 2002.

Sun et al., "Template-Engaged Replacement Reaction: A One-Step Approach to the Large-Scale Synthesis of Metal Nanostructures with Hollow Interiors," *Nano Letters* 2(5):481-485, 2002.

Sun et al., "Large-Scale Synthesis of Uniform Silver Nanowires Through a Soft, Self-Seeding, Polyol Process," *Adv. Mater.* 14(11):833-837, Jun. 5, 2002.

Sun et al., "Uniform Silver Nanowires Synthesis by Reducing $AgNo_3$ with Ethylene Glycol in the Presence of Seeds and Poly(Vinyl Pyrrolidone)," *Chem. Mater.* 14(11):4736-4745, 2002.

Sun et al., "Polyol Synthesis of Uniform Silver Nanowires: A Plausible Growth Mechanism and the Supporting Evidence," *Nano Letters* 3(7):955-960, 2003.

Tang et al., "Rapid and high-yield synthesis of silver nanowires using air-assisted polyol method with chloride ions," *Colloids and Surfaces A: Physicochemical and Engineering Aspects* 338:33-39, 2009.

ULVAC Materials Division Inc., "Nano-metal ink," Apr. 7, 2011, retrieved from http://www.ulvac.co.jp/eng/products/materials/nanoparticle-technology.html, 2 pages.

ULVAC Materials Division Inc., "Establishment of the World's First Consortium for the Development and Commercialization of Next-Generation Functional Circuit Boards Using Nano Paste," Oct. 23, 2002, retrieved from http://www.ulvac.co.jp/eng/information/news/2002/20021023.html, 3 pages.

Wiley et al., "Polyol Synthesis of Silver Nanostructures: Control of Product Morphology with Fe(II) or Fe(III) Species," *Langmuir* 21(18):8077-8080, Aug. 30, 2005.

Wiley et al., "Polyol Synthesis of Silver Nanoparticles: Use of Chloride and Oxygen to Promote the Formation of Single-Crystal, Truncated Cubes and Tetrahedrons," *Nano Letters* 4(9):1733-1739, 2004.

Wiley et al., "Polyol Synthesis of Silver Nanoparticles: Use of Chloride and Oxygen to Promote the Formation of Single-Crystal, Truncated Cubes and Tetrahedrons," *Nano Letters* 4(10):2057, 2004. [correction to 4(9):1733-1739, 2004].

Yang et al., "Anisotropic Synthesis of Boat-Shaped Core-Shell Au-Ag Nanocrystals and Nanowires," *Nanotechnology* 17:2304-2310, Apr. 11, 2006.

\* cited by examiner

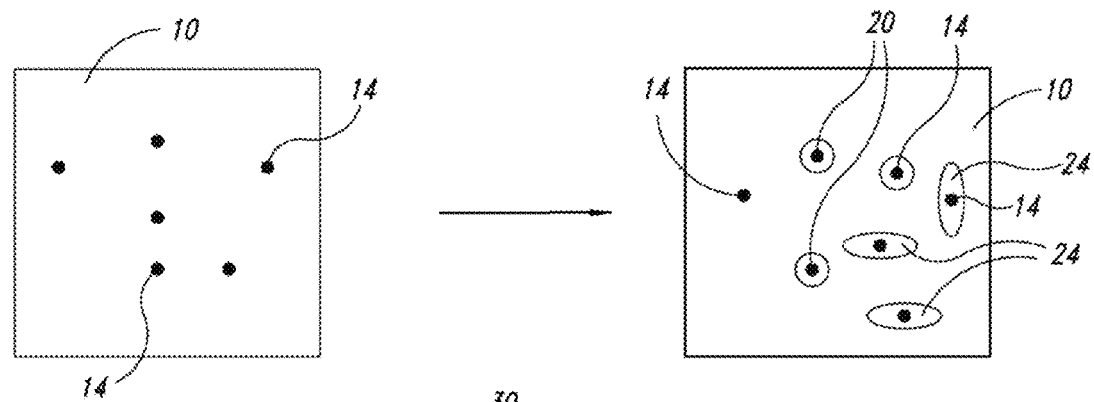
FIG. 1A (Prior Art)
FIG. 1B (Prior Art)
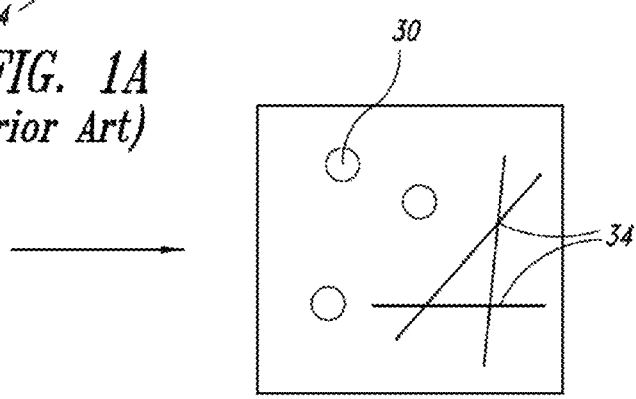
FIG. 1C (Prior Art)
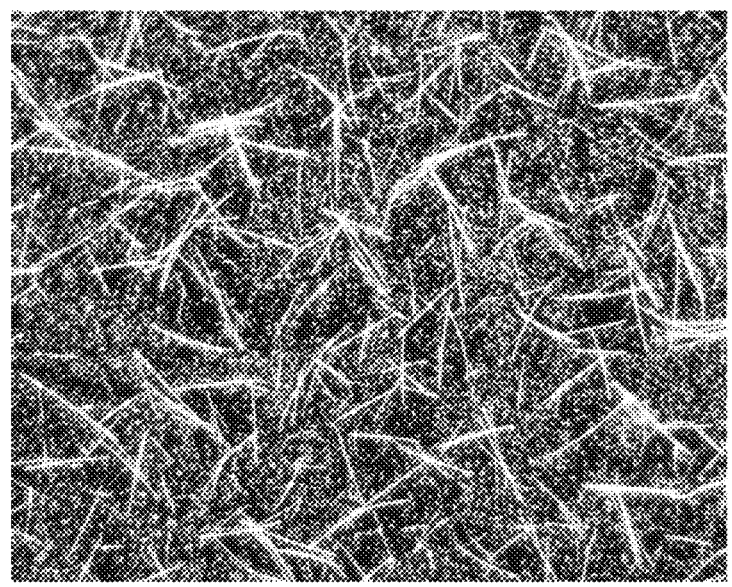
FIG. 2 (Prior Art)

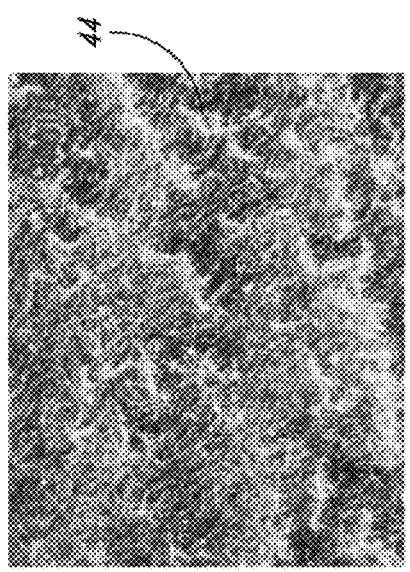
FIG. 5C  9 Min
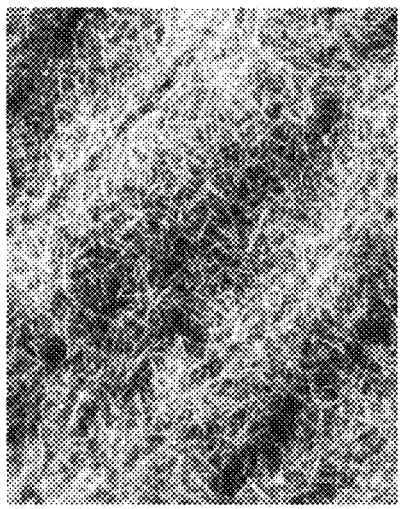
FIG. 5F  20 Min
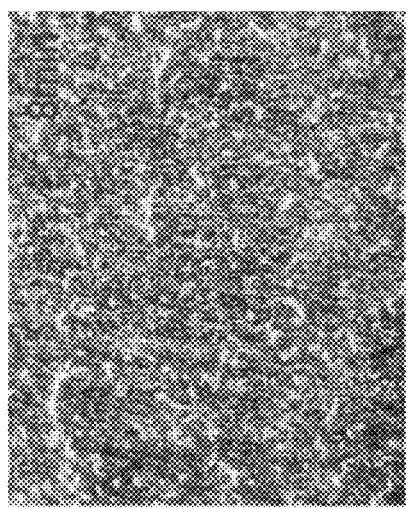
FIG. 5B  8 Min
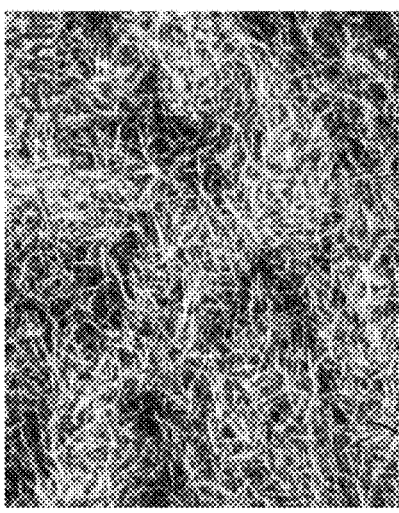
FIG. 5E  15 Min
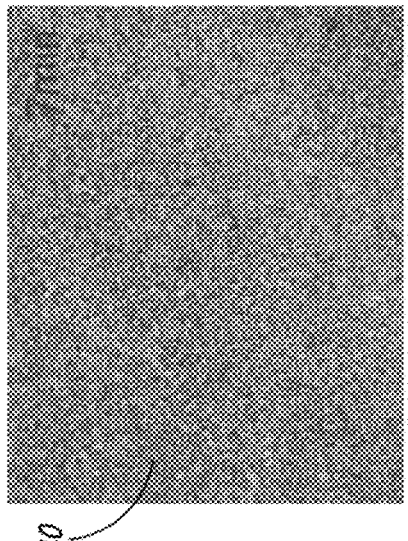
FIG. 5A  7 Min
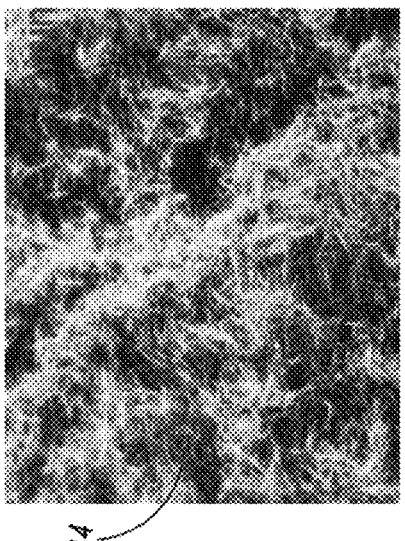
FIG. 5D  10 Min

METHODS OF CONTROLLING NANOSTRUCTURE FORMATIONS AND SHAPES

CROSS-REFERENCE TO RELATED APPLICATION

This application is a continuation application of U.S. application Ser. No. 13/040,549, filed Mar. 4, 2011, now allowed, which is a divisional of U.S. application Ser. No. 11/766,552 filed Jun. 21, 2007, now issued as U.S. Pat. No. 8,454,721; which claims the benefit under 35 U.S.C. §119(e) of U.S. Provisional Patent Application No. 60/815,627 filed Jun. 21, 2006; which applications are incorporated herein by reference in their entireties.

BACKGROUND

1. Technical Field

This application is related to methods of controlling the amount, shape and dimension of nanostructures by solution-based synthesis, more specifically, to the controlled formation of metal nanowires.

2. Description of the Related Art

Nano-sized materials (or nanomaterials) can differ markedly from their analogous bulk materials. In particular, the physical and chemical properties of nanomaterials correlate strongly with their size, shape and morphology. As a result, materials scientists have focused their efforts on developing simple and effective methods for fabricating nanomaterials with controllable shapes, sizes and morphology, hence tailoring their properties.

A solution-based synthesis (also referred to as the "polyol" process) is reasonably effective in large-scale production of metal nanostructures. See, e.g., Sun, Y. et al., (2002) *Science,* 298, 2176; Sun, Y. et al., (2002) *Nano Lett.* 2, 165; Sun, Y. et al., (2002) *Adv. Mater.* 14, 833; Kim, F. et al., (2004) *Angew. Chem. Int. Ed.* 116, 3759; and U.S. Published Application 2005/0056118. The polyol process involves the reduction of a precursor (e.g., a metal salt) of the metal nanostructure by a polyol (e.g., ethylene glycol) in the presence of poly(vinyl pyrrolidone) ("PVP"). Typically, the reduction is carried out at a temperature of no more than 200° C. Ethylene glycol serves the dual functions as the solvent and the reducing agent. Typically, the shapes and sizes of the nanostructures formed are affected by parameters including, relative amounts of PVP and the metal salt, concentrations of PVP and the metal salt, reaction time, and reaction temperature.

According to this method, metal nanostructures of various morphologies, including nanocubes, nanowires, nanopyramides and multiply twinned particles, have been obtained. However, a common problem of the polyol process is that a mixture of nanostructures of several shapes is produced. The problem is compounded by poor reproducibility of the process, which is likely caused by trace amount of contaminants in the constituents of the synthesis. See, e.g., Wiley, B. et al., (2004) *Nano Lett.* 4(9), 1733-1739.

The polyol process has been modified in efforts to form nanostructures of uniform shapes and sizes. For example, adding trace amount of chloride to the "polyol" process created single crystal truncated cubes and tetrahedrons. See, e.g., Wiley, B. et al., (2004) *Nano Lett.* 4(9), 1733-1739. Using a seed material (e.g., platinum or silver nanoparticles) in the "polyol" process generated uniform silver nanowires of high aspect ratio (about 1000). Sun, Y. et al. (2002) *Chem. Mater.* 14, 4736-4745. However, the problem of producing mixed nanostructures (e.g., the silver nanowires were accompanied by the formation of silver nanoparticles) persists in the existing methods. Additional separation steps are therefore necessary to obtain monodispersed nanostructures.

There remains a need in the art to fabricate nanostructures with controllable shapes and sizes in an effective and reproducible fashion.

BRIEF SUMMARY

One embodiment describes a modified polyol method for selective formation of metal nanowires, the method comprises: forming a reaction mixture including a metal salt, a capping agent and a quaternary ammonium chloride in a reducing solvent; and forming metal nanowires by reducing the metal salt in the reaction mixture.

In various embodiments, the capping agent is poly(vinyl pyrrolidone), polyacrylamide, polyacrylic or a copolymer thereof.

In various embodiments, the reducing solvent comprises at least two hydroxyl groups. More specifically, the reducing solvent can be ethylene glycol, 1,2-propylene glycol, 1,3-propylene glycol, glycerin, glycerol, or glucose.

Another embodiment describes a composition comprising: a metal salt; a capping agent selected from poly(vinyl pyrrolidone), polyacrylamide, polyacrylic and copolymers thereof; a quaternary ammonium chloride; and a reducing solvent including at least two hydroxyl groups.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been selected solely for ease of recognition in the drawings.

FIGS. 1A-1C illustrate schematically the nucleation and growth of nanostructures of different morphologies in a polyol process.

FIG. 2 shows the reaction products of mixed nanowires and nanoparticles according to a standard polyol process.

FIGS. 5A-5F show a progression of the nanowire formation at different reaction times.

DETAILED DESCRIPTION

Figure 3:
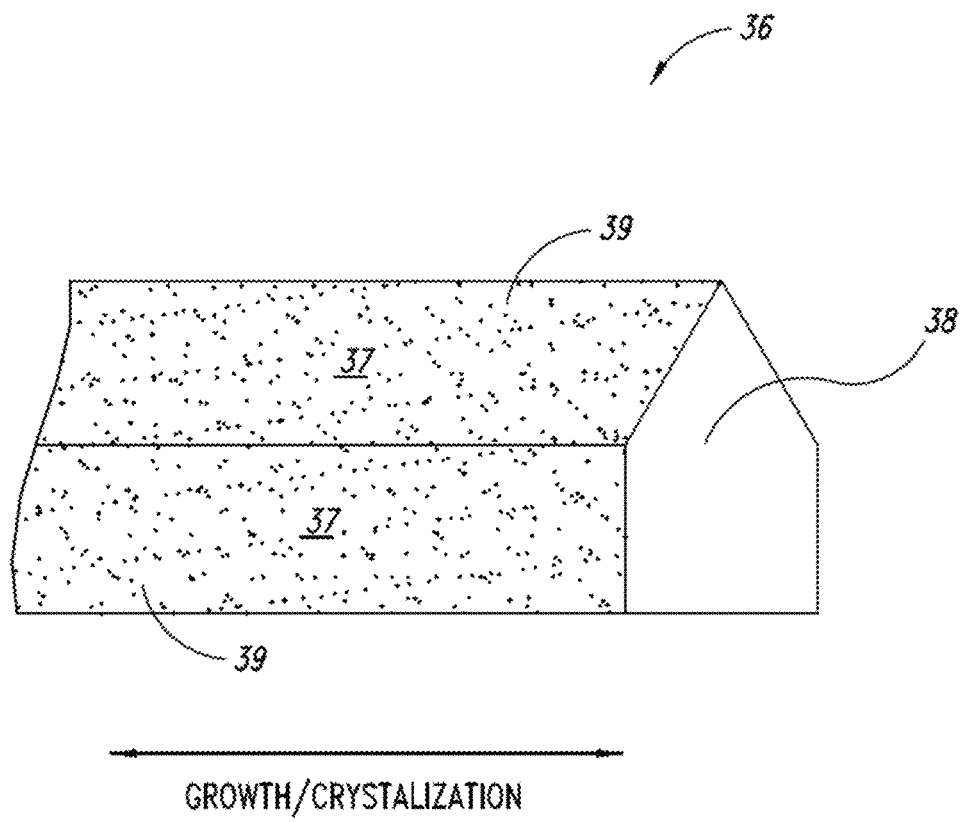
FIG. 3 schematically illustrates a one-dimensional growth of a nanowire with the assistance of a capping agent.

Nanowires, especially metal nanowires, can be used as conductive media in many applications. In particular, networks of metal nanowires (e.g., silver nanowires) impart both electrical conductivity and high optical transmission, which makes them a suitable material for fabricating transparent conductors.

Nanowires formed by the standard polyol process are typically accompanied by varying amounts of nanoparticles. See, e.g. Sun, Y. et al. (2002) *Chem. Mater.* 14, 4736-4745. As used herein, both "nanoparticles" and "nanowires" refer to nanostructures in which at least one dimension is less than 500 nm. For example, at least one dimension of the nanostructure may be less than 100 nm, less than 50 nm, or less than 10 nm.

A nanowire is a one-dimensional nanostructure of high aspect ratio (length/width), i.e., the nanowire has an aspect ratio of greater than 10. Typically, the nanowire has an aspect ratio of greater than 50, more typically greater than 100, and more typically greater than 1000. In contrast, a nanoparticle has an aspect ratio of no more than 10. For example, the nanoparticle typically has an aspect ratio of no more than 5, and more typically no more than 2, more typically no more than 1.

FIGS. 1A-1C schematically illustrate the formation of these nanostructures in a standard polyol process. At an initial stage (FIG. 1A), the metal salt is reduced to elemental metal atoms by ethylene glycol in a solution phase 10. In general, the metal atoms initially form small particulate seeds 14 through a homogeneous nucleation process. These particulate seeds typically have diameters in the range of 1-5 nm. Some of these seeds proceed to grow in the solution phase 10 into isotropic nanostructures 20, which result from a growth that progresses indiscriminately in all dimensions. In contrast, some seeds grow into anisotropic nanostructures 24, which result from a preferential growth along a lateral dimension. As shown in FIG. 1C, the isotropic nanostructures 20 and anisotropic nanostructures 24 continue to grow into larger structures while maintaining their basic morphologies. Nanoparticles 30 and nanowires 34 are obtained. It is noted that during the growth process, smaller particles are less stable and typically spontaneously dissolve and contribute to the growth of the larger particles. See, e.g., U.S. Published Patent Application No. 2005/0056118.

Although reaction conditions such as the reaction time and temperature can be adjusted to bias the formation of the nanowires, the standard polyol process fails to produce uniform nanowires in satisfactory yields. FIG. 2 is an image of the reaction products of a standard polyol process using silver nitrate as the precursor. As shown, both nanowires and nanoparticles are present.

One embodiment thus describes a method of forming monodispersed nanostructures (e.g., nanowires) based on a modified polyol process, which is mediated by an ionic additive. It is believed that the ionic additive promotes the formation of a single morphology while discouraging other competing nanostructures. In particular, the method produces predominately nanowires with no or few nanoparticles. As used herein, "monodispersity" refers to at least 85%, more preferably, at least 90%, 95% or 98% by weight of nanowires.

More specifically, the method comprises: forming a reaction mixture including a metal salt, an ionic additive and a capping agent in a reducing solvent; and forming metal nanowires by reducing the metal salt in the reaction mixture.

"Metal salt" refers to a neutral compound having a positively charged metal ion and a negatively charged counterion. The counterion may be inorganic or organic. Exemplary metal salts include, without limitation: silver nitrate ($AgNO_3$), silver acetate ($CH_3COO)_2Ag$), silver perchlorate ($AgClO_4$), gold perchlorate ($Au(ClO_4)_3$), palladium chloride ($PdCl_2$), platinum chloride ($PtCl_2$) and the like. Typically, the metal salt is soluble in the reducing solvent (e.g. ethylene glycol) and dissociates into oppositely charged metal ion and the counterion. Typically, the solubility of the metal salt in the reducing solvent is at least 0.001 g/ml, at least 0.05 g/ml, or at least 0.1 g/ml.

Reduction of the metal salt in the above reaction mixture produces corresponding elemental metal. The elemental metal crystallizes or grows into a one-dimensional nanostructure (i.e. nanowires). Suitable metal nanowires therefore include without limitation, silver, gold, copper, nickel, palladium, platinum and gold-plated silver nanowires.

"Capping agent" refers to a chemical agent that preferentially interacts and adheres to a lateral surface of a growth nanowire, such that the capping agent confines the lateral surface from growing and encourages a cross section surface of the nanowire to crystallize. FIG. 3 schematically illustrates a one-dimensional growth of the growing nanowire 36. The growing nanowire 36 includes the lateral surface 37 and the cross section surface 38. The capping agent 39 interacts with the lateral surface 36 more strongly than it does with the cross section surface 38. The lateral surface 36 is thus passivated while the cross section surface 38 is available for further crystallization to produce the nanowire. Examples of the capping agent include without limitation, poly(vinyl pyrrolidone), polyarylamide, polyacrylic and any of the copolymers thereof.

"Reducing solvent" refers to a polar solvent in which the metal salt, the ionic additive and the capping agent are soluble. In addition, the reducing solvent functions as a reducing agent to transform the metal salt to its corresponding elemental metal. Typically, the reducing solvent is a chemical reagent comprising at least two hydroxyl groups. Examples of the reducing solvents include without limitation, diols, polyols, glycols, or mixtures thereof. More specifically, the reducing solvent can be, for example, ethylene glycol, 1,2-propylene glycol, 1,3-propylene glycol, glycerin, glycerol, and glucose.

"Ionic additive" refers to a salt additive comprising a cation and an anion. The cation and anion are associated by ionic interaction and dissociate in polar solvents such as water, alcohol, diols and polyols (including ethylene glycol, 1,2-propylene glycol, 1,3-propylene glycol, glycerin, glycerol, and glucose). The cation can be organic or inorganic. The anions are typically inorganic. Exemplary anions include halides ($Cl^-$, $Br^-$, $I^-$, $F^-$), phosphate ($PO_4^{3-}$), sulfate ($SO_4^{2-}$), hydrogen sulfate ($HSO_4^-$), aryl and alkyl sulfonates ($RSO_3^-$), and the like. The ionic additive may further include their corresponding acids, i.e., the cation is a proton.

In certain embodiments, the ionic additive is a quaternary ammonium chloride. As used herein, "quaternary ammonium chloride" refers to ammonium chloride ($NH_4^+Cl^-$) in which, all four hydrogens have been replaced by an organic group. Thus, the quaternary ammonium chloride can be typically represented by formula $NR_4^+Cl^-$, wherein each R is the same or different and independently an alkyl, alkenyl, alkynyl, aryl, or aralkyl.

"Alkyl" refers to monovalent saturated hydrocarbon structure of between 1 and 20 carbons, in which the carbons are arranged in either a linear or branched manner. Lower alkyl refers to alkyl groups of 1 to 5 carbon atoms. Examples of lower alkyl groups include methyl, ethyl, propyl, isopropyl, butyl, s- and t-butyl and the like. Examples of alkyl groups of longer chains include octyl ($C_8$), decyl ($C_{10}$), dodecyl ($C_{12}$), cetyl ($C_{16}$), and the like. When an alkyl residue having a specific number of carbons is named, all geometric isomers having that number of carbons are contemplated; thus, for example, "butyl" is meant to include n-butyl, sec-butyl, isobutyl and t-butyl; propyl includes n-propyl and isopropyl.

Unless specified otherwise, the alkyl can be optionally substituted with a halogen (F, Br, Cl or I), alkoxy, amine and the like.

"Alkenyl" refers to a monovalent hydrocarbon structure of between 2 and 20 carbon atoms with at least one double bond. Examples include without limitation: ethenyl, propenyl, butenyl, pentenyl, hexenyl, butadienyl, pentadienyl and the like. Unless specified otherwise, the alkyl can be optionally substituted with a halogen (F, Br, Cl or I), alkoxy, amine or the like.

"Alkynyl" refers to a monovalent hydrocarbon structure of between 2 and 20 carbon atoms with at least one triple bond. Examples include without limitation: ethynyl, propynyl, butynyl, pentynyl, hexynyl, methylpropynyl, 4-methyl-1-butynyl, 4-propyl-2-pentynyl and the like.

"Alkoxy" refers to a radical of the formula —O-alkyl. Examples include methoxy, ethoxy, propoxy, isopropoxy, and the like. Lower-alkoxy refers to groups containing one to five carbons.

"Aryl" refers to optionally substituted phenyl or naphthyl. Exemplary substituents for aryl include one or more of halogen, hydroxy, alkoxy, amino, mercapto or the like.

"Aralkyl" refers to an alkyl residue substituted with at least an aryl group. The aralkyl can be typically represented by the formula aryl-alkyl-. Exemplary aralkyls include without limitation phenylmethyl (i.e., benzyl) or phenylethyl group.

Exemplary ionic additives therefore include without limitation: tetramethylammonium chloride (TMAC), tetrabutylammonium chloride (TBAC), cetyl trimethylammonium chloride (CTAC), $C_8$-$C_{18}$ alkyl dimethyl benzyl ammonium chloride, methyl trioctylammonium chloride (i.e., Aliquat 336®) and the like.

Quaternary ammonium ions ($NR_4^+$) are permanently charged cations that typically are not influenced by the pH of their environment. They are soluble in the reducing solvent, as defined herein. Moreover, they are compatible with the capping agent (e.g., PVP and its copolymers) due to the organic moieties present.

The quaternary ammonium ions differ from inorganic cations in their effects on the formation of silver nanowires in the modified polyol process. More specifically, the presence of a quaternary ammonium based ionic additive encourages a predominately anisotropic growth of nanostructures to produce nanowires in relatively high yield and relatively high monodispersity.

FIGS. 4A-4D show images of silver nanowire formations using various chloride-based ionic additives, including HCl, $ZnCl_2$, $MgCl_2$ and TBAC, respectively. All the reactions were carried out by initially mixing 0.1M $AgNO_3$, 0.15M PVP and 0.001M of the chlorides at room temperature (25° C.) to 40° C. The reaction mixture was then heated to about 160° C. Typically, nanostructures (nanowires and/or nanoparticles) were formed rapidly after a brief induction period (10-30 minutes). The products were collected after about 30 minutes.

Figure 4B:
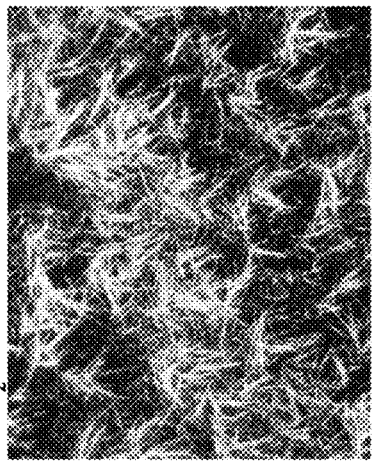
FIGS. 4A-4D illustrate various embodiments in which various chloride additives are used in modified polyol processes.
Figure 4D:
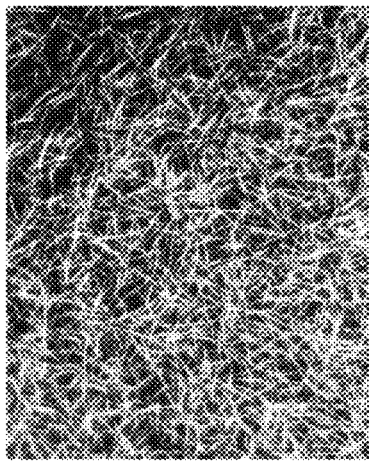
Figure 4A:
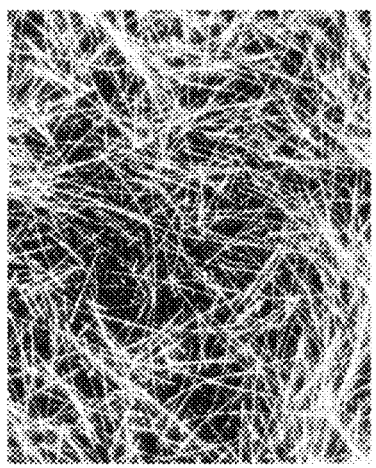
Figure 4C:
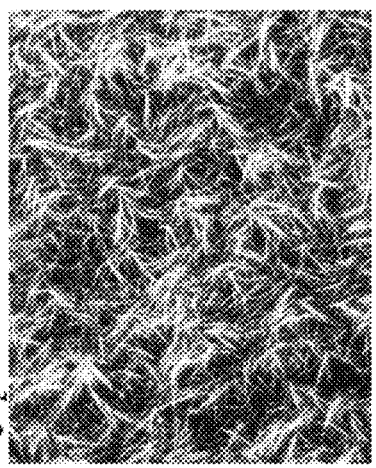

FIGS. 4A-4C show that silver nanowires were formed accompanied by varying degrees of other nanostructures (e.g., nanoparticles). FIG. 4D, by comparison, shows uniform silver nanowires of between 3 and 100 μm long with little or no nanoparticle formation. The yield of the silver nanowires is therefore particularly optimized using TBAC as the additive, with high overall yield and high monodispersity.

The anion (i.e., chloride) in the ionic additive also plays an important role in controlling the nanowire formation. It is found that ionic additives based on other halides (e.g., bromide), do not have the same effect as the chloride-based ionic additive. For example, using cetyl trimethylammonium bromide in the place of cetyl trimethylammonium chloride produces only nanoparticles.

It has been further observed that the concentrations of the constituents in the reaction mixture have certain impact on the formation of the nanostructures and their yields. For example, the metal salt in the reaction mixture is typically in the range of about 0.01M to 0.2M, more preferably 0.05M to 0.1M, for an optimal yield of nanowires. In addition, the concentration of PVP is typically in the range of 0.01M to 0.2M, more preferably, 0.05M to 0.15M.

In various embodiments, the concentration of the quaternary ammonium chloride in the reaction mixture is in the range of 0.001M-0.5 M. Preferably, the concentration is less than 0.1M to avoid precipitation. Typically, the relative molar ratio between the quaternary ammonium chloride and the metal salt is about 0.1% to 10%, more preferably, about 0.5% to 1%.

The reaction temperature influences the yields and length of the metal nanowires formed. Typically, the metal salt, PVP and the ionic additive are mixed in ethylene glycol at a first temperature to provide a reaction mixture. The first temperature can be in the range of about 20° C. to 40° C. The reaction mixture is thoroughly mixed before it is heated to a second temperature. The second temperature is typically maintained in a range of about 50° C. to about 200° C., more typically, at about 150-160° C. At temperatures higher than 170° C., shorter nanowires were formed as compared to the nanowires formed at lower temperatures.

The yield and length of the metal nanowires produced by the modified polyol process are further controlled by the reaction time. FIGS. 5A-5F illustrate a progression of the nanowire formation visualized at ×100 DF. Samples were taken from the reaction mixture at the reaction times indicated. Each sample was cooled in an ice bath to halt the growth of the nanostructures. FIG. 5A shows that within an initial induction period (about 7 minutes), minute particles 40 (e.g., seeds) were formed. As shown in FIGS. 5B-5D, in the next 3 minutes, nanowires 44 rapidly took shape. At 15 minutes into the reaction, longer nanowires 48 populated the reaction mixture (FIG. 5E). Thereafter, an additional 5 minutes yielded more nanowires (FIG. 5F). The reaction was completed within 30 minutes, whereby no more nanowires were formed even with prolonged reaction time.

The reaction times are greatly influenced by the choice of solvent, e.g. 1,2-propylene glycol leads to faster nanowire growth than ethylene glycol while glycerol shows slower reaction rates.

The modified polyol process is described in more detail by the following non-limiting examples.

EXAMPLES

Example 1

Modified Polyol Process—Microscale

In a 10 ml vial, 0.5 ml solution of $AgNO_3$ in ethylene glycol (0.1M) was combined with 0.5 ml solution of PVP in ethylene glycol (0.15M) and 0.5 ml solution of tetrabutylammonium chloride in ethylene glycol (0.001M) at room temperature (25° C.). The vial was dipped into an oil bath (190° C.) for 20-30 minutes for the reaction to complete.

Grey and iridescent reaction products were obtained. Visualization under a microscope (×100 DF) indicated uniform nanowires were formed.

The reaction products were allowed to settle to the bottom of the vial and the ethylene glycol was removed. The reaction products were dried, and the reaction products were then re-suspended in 5 ml deionized water. The suspension was filtered through a glass frit (Fine, 4-6 µm, Kontes). The retentate (containing nanowires which could not filter through the frit) were dried and weighed.

Further analysis of the reaction products indicated that they were substantially nanowires, with no or very few nanoparticles.

The silver nanowires produced had a mean diameter of 75±8 nm, and an average length of 9.7±2.6 µm.

The microscale reaction described herein was highly reproducible which consistently yielded at a high percentage of silver nanowires.

Example 2

Without Ionic Additive

Figure 6:
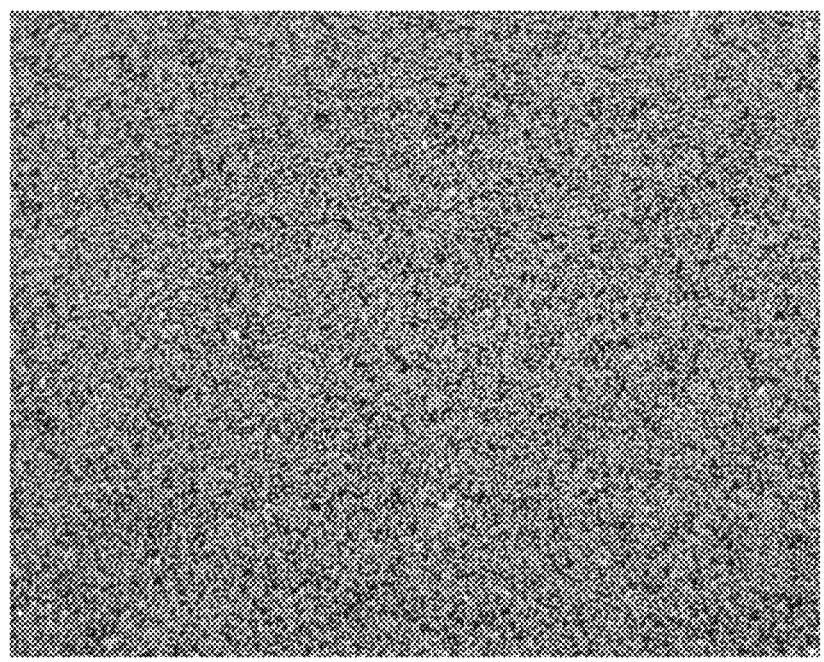
FIG. 6 shows the reaction products of an embodiment in which no ionic additive is present.

As a comparison, the reaction of Example 1 was carried out without the tetrabutylammonium chloride additive. As shown in FIG. 6, only nanoparticles were obtained.

Example 3

Modified Polyol Process—Large-Scale

In a 1000 ml flask, 4.171 g PVP (MW=50,000, 37.6 mmol), 70 mg tetrabutylammonium chloride (0.25 mmol), and 4.254 g $AgNO_3$ (25 mmol) were mixed in 500 ml ethylene glycol). The reaction mixture was stirred at room temperature (25° C.) for 15 minutes before the flask was heated with a heating mantle set to 200° C. The internal temperature of the reaction mixture was controlled at about 150° C. Within 30 minutes, the reaction mixture has turned into a grey and iridescent suspension of silver nanowires. The silver nanowires produced had a mean diameter of 62±7 nm, and an average length of 8.5±1.9 µm. There was no precipitate or nanoparticles formed (See, e.g., FIG. 4D).

The large-scale reaction described herein was highly reproducible.

Example 4

Comparative Result—Standard Polyol Process

For comparison purpose, silver nanowires were also prepared according to the method described in U.S. Published Patent Application No. 2005/0056118. More specifically, 5 ml ethylene glycol was preheated at 160° C. 3 ml of AgNO3 solution in ethylene glycol (0.085M) and 3 ml of PVP solution in ethylene glycol (0.13M) were simultaneously added to the preheated ethylene glycol. The reaction mixture was heated and maintained at 160° C. for 40 minutes. The resulting products were observed as a mixture of nanowires and nanoparticles, shown in FIG. 2.

Example 5

Modified Polyol Process—Large-Scale

In a 5000 ml flask, 49.98 g PVP (MW=50,000, 450 mmol), 0.84 g tetrabutylammonium chloride (3 mmol), and 51.02 g $AgNO_3$ (300 mmol) were mixed in 3000 ml ethylene glycol). The PVP was thoroughly dispersed in about ⅓ of the ethylene glycol with a high shear mixer before being added into the reaction flask. The reaction mixture was stirred at room temperature (25° C.) for 15 minutes before the flask was heated with a heating mantle set to 200° C. The internal temperature of the reaction mixture was controlled at about 140° C. Within 30 minutes, the reaction mixture has turned into a grey and iridescent suspension of silver nanowires. The silver nanowires produced had a mean diameter of 82.6±22.3 nm, and an average length of 14.1±8.1 µm. There were few nanoparticles formed.

The large-scale reaction described herein was highly reproducible.

Example 6

Modified Polyol Process—Lower Temperature

In a 100 ml flask, 0.42 g PVP (MW=50,000, 3.76 mmol), 0.07 ml tetrabutylammonium chloride (0.25 mmol), and 0.43 g $AgNO_3$ (2.5 mmol) were mixed in 50 ml ethylene glycol). The reaction mixture was stirred at room temperature (25° C.) for 15 minutes before the flask was heated in an oven set to 80° C. without stirring. Within 2 weeks, the reaction mixture turned into a grey and iridescent suspension of silver nanowires. The silver nanowires produced had a mean diameter of 62±18 nm, and an average length of 43±20 µm. The reaction products were predominantly long, thin nanowires.

Example 7

Modified Polyol Process—1,3-Propylene Glycol Solvent

In a 1000 ml flask, 4.17 g PVP (MW=50,000, 37.6 mmol), 72 mg tetrabutylammonium chloride (0.25 mmol), and 4.25 g $AgNO_3$ (25 mmol) were mixed in 500 ml 1,2-propylene glycol). The reaction mixture was stirred at room temperature (25° C.) for 15 minutes before the flask was heated with a heating mantle set to 200° C. The internal temperature of the reaction mixture was controlled at about 160° C. Within 30 minutes, the reaction mixture turned into a grey and iridescent suspension of silver nanowires. The reaction products were predominantly nanowires.

Example 8

Modified Polyol Process—1,2-Propylene Glycol Solvent

Figure 7:
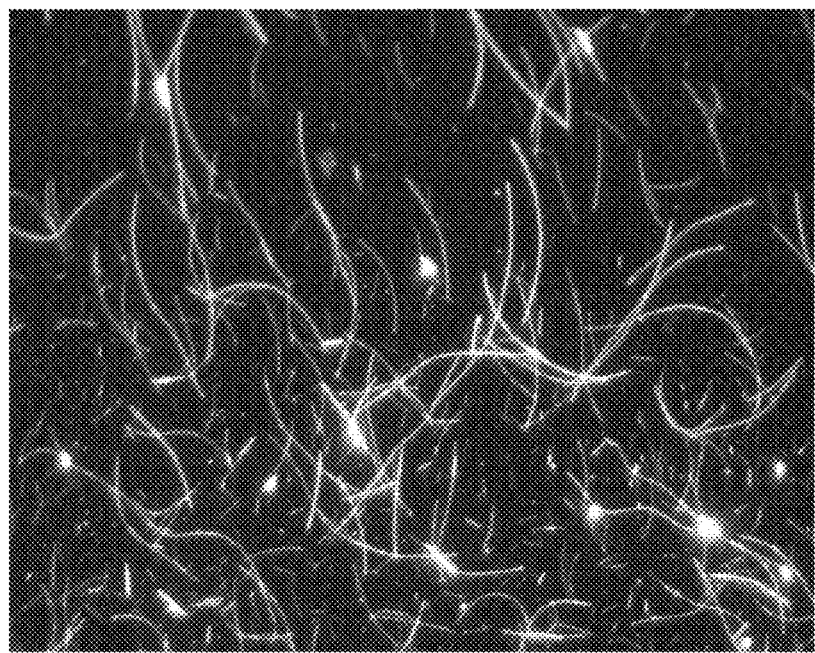
FIG. 7 shows an embodiment in which 1,2-propylene glycol was used as the reducing solvent.

In a 1000 ml flask, 0.417 g PVP (MW=50,000, 3.76 mmol), 7.2 mg tetrabutylammonium chloride (0.025 mmol), and 0.425 g $AgNO_3$ (2.5 mmol) were mixed in 50 ml 1,2-propylene glycol). The reaction mixture was stirred at room temperature (25° C.) for 15 minutes before the flask was heated with a heating mantle set to 81° C. Within 2 days, the reaction mixture turned into a grey and iridescent suspension of silver nanowires. The reaction products were predominantly nanowires as shown in FIG. 7.

Example 9

Modified Polyol Process—1,3-Propylene Glycol Solvent

Figure 8:
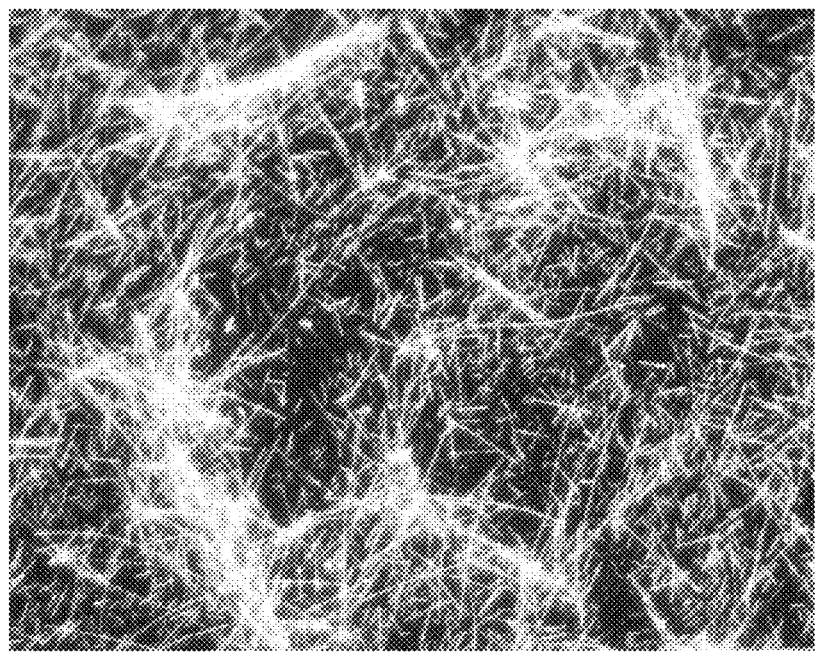
FIG. 8 shows an embodiment in which 1,3-propylene glycol was used as the reducing solvent.

In a 100 ml flask, 0.42 g PVP (MW=50,000, 3.76 mmol), 0.07 ml tetrabutylammonium chloride (0.25 mmol), and 0.43 g AgNO$_3$ (2.5 mmol) were mixed in 50 ml 1,3-propylene glycol). The reaction mixture was stirred at room temperature (25° C.) for 15 minutes before the flask was heated in an oven set to 100° C. without stirring. Within 12 hours, the reaction mixture turned into a grey and iridescent suspension of silver nanowires. The reaction products were predominantly nanowires as shown in FIG. 8.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A composition comprising:
a metal salt;
a capping agent selected from poly(vinyl pyrrolidone), polyacrylamide, polyacrylic and copolymers thereof;
an ionic additive; and
a polar solvent capable of reducing the metal salt, wherein a molar ratio of the ionic additive and the metal salt is between about 0.001 and 0.1.

2. The composition of claim 1 wherein the metal salt is silver nitrate, silver acetate, silver perchlorate, gold perchlorate, palladium chloride, or platinum chloride.

3. The composition of claim 1 wherein the ionic additive comprises an anion selected from the group consisting of chloride, iodide, fluoride, phosphate, sulfate, hydrogen sulfate, and sulfonate.

4. The composition of claim 3 wherein the ionic additive is HCl, ZnCl2, or MgCl2.

5. The composition of claim 1 wherein the molar ratio of the ionic additive and the metal salt is about 0.1.

6. The composition of claim 1 wherein the polar solvent is ethylene glycol, 1,2-propylene glycol, 1,3-propylene glycol, glycerin, glycerol, or glucose.

7. The composition of claim 1 wherein the capping agent is poly(vinyl pyrrolidone) having a molecular weight of 50,000.

8. The composition of claim 1 further comprising silver nitrate, poly(vinyl pyrrolidone), a chloride additive and ethylene glycol.

9. The composition of claim 1 further comprising a plurality of metal nanowires.

10. A composition comprising:
a metal salt;
a capping agent;
a chloride additive; and
a polar solvent capable of reducing the metal salt, wherein a molar ratio of the chloride additive and the metal salt is between about 0.001 and 0.1.

11. The composition of claim 10 wherein the metal salt is silver nitrate, silver acetate, silver perchlorate, gold perchlorate, palladium chloride, or platinum chloride.

12. The composition of claim 10 wherein the chloride additive is HCl, ZnCl2, or MgCl2.

13. The composition of claim 10 wherein the polar solvent is ethylene glycol, 1,2-propylene glycol, 1,3-propylene glycol, glycerin, glycerol, or glucose.

14. The composition of claim 10 wherein the capping agent is selected from poly(vinyl pyrrolidone), polyacrylamide, polyacrylic and copolymers thereof.

15. The composition of claim 14 wherein the capping agent is poly(vinyl pyrrolidone) having a molecular weight of 50,000.

16. The composition of claim 10 further comprising a plurality of metal nanowires.

* * * * *

(12) EX PARTE REEXAMINATION CERTIFICATE (11602nd)
United States Patent
Allemand

(10) Number: US 9,440,291 C1
(45) Certificate Issued: Nov. 18, 2019

(54) METHODS OF CONTROLLING NANOSTRUCTURE FORMATIONS AND SHAPES

(71) Applicant: CHAMP GREAT INT'L CORPORATION, Eden Island, SC (US)

(72) Inventor: Pierre-Marc Allemand, San Jose, CA (US)

(73) Assignee: Cambrios Film Solutions Corporation

Reexamination Request:
No. 90/014,185, Aug. 20, 2018

Reexamination Certificate for:
Patent No.: 9,440,291
Issued: Sep. 13, 2016
Appl. No.: 14/247,689
Filed: Apr. 8, 2014

Related U.S. Application Data

(60) Continuation of application No. 13/040,549, filed on Mar. 4, 2011, now Pat. No. 8,709,125, which is a division of application No. 11/766,552, filed on Jun. 21, 2007, now Pat. No. 8,454,721.

(60) Provisional application No. 60/815,627, filed on Jun. 21, 2006.

(51) Int. Cl.
*B22F 9/24* (2006.01)
*C30B 29/60* (2006.01)
*C30B 7/14* (2006.01)
*B22F 1/00* (2006.01)
*B82Y 30/00* (2011.01)
*B82Y 40/00* (2011.01)

(52) U.S. Cl.
CPC .............. *B22F 9/24* (2013.01); *B22F 1/0025* (2013.01); *B82Y 30/00* (2013.01); *B82Y 40/00* (2013.01); *C30B 7/14* (2013.01); *C30B 29/60* (2013.01); *B22F 2009/245* (2013.01); *B22F 2301/25* (2013.01); *B22F 2301/255* (2013.01); *B22F 2304/054* (2013.01); *B22F 2998/00* (2013.01); *B22F 2998/10* (2013.01); *B22F 2999/00* (2013.01)

(58) Field of Classification Search
None
See application file for complete search history.

(56) References Cited

To view the complete listing of prior art documents cited during the proceeding for Reexamination Control Number 90/014,185, please refer to the USPTO's public Patent Application Information Retrieval (PAIR) system under the Display References tab.

*Primary Examiner* — Sean E Vincent

(57) ABSTRACT

A method of forming monodispersed metal nanowires comprising: forming a reaction mixture including a metal salt, a capping agent and an ionic additive in a polar solvent at a first temperature; and forming metal nanowires by reducing the metal salt in the reaction mixture.

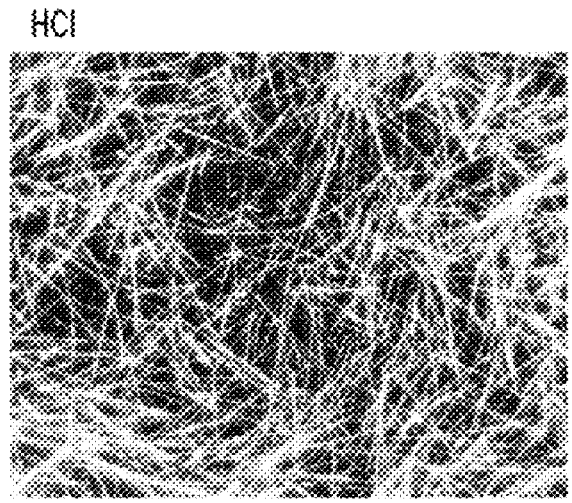

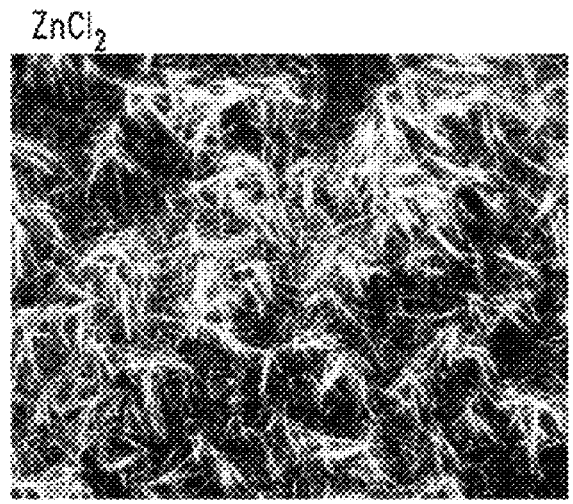

EX PARTE REEXAMINATION CERTIFICATE

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 10-16 are cancelled.

Claims 1, 2, 4, 8 and 9 are determined to be patentable as amended.

Claims 3 and 5-7, dependent on an amended claim, are determined to be patentable.

New claims 17-32 are added and determined to be patentable.

1. A composition comprising:
   a metal salt *having a silver ion*;
   a capping agent selected from poly(vinyl pyrrolidone), polyacrylamide, polyacrylic and copolymers thereof;
   an ionic additive, *wherein the ionic additive does not have a proton cation*; and
   a polar solvent capable of reducing the metal salt, wherein a molar ratio of the ionic additive and the metal salt is between about [0.001] *0.005* and 0.1.

2. The composition of claim 1 wherein the metal salt is silver nitrate, silver acetate, *or* silver perchlorate[, gold perchlorate, palladium chloride, or platinum chloride].

4. The composition of claim 3 wherein the ionic additive is [HCl, ZnCl2, or MgCl2] *ZnCl₂ or MgCl₂*.

8. The composition of claim 1 [further comprising] *wherein the metal salt is* silver nitrate, *the capping agent is* poly(vinyl pyrrolidone), *the ionic addictive is* a chloride additive and *the polar solvent is* ethylene glycol.

9. The composition of claim 1 further comprising a plurality of [metal] *silver* nanowires.

*17. The composition of claim 1 wherein the ionic additive comprises a halide anion.*

*18. The composition of claim 9 wherein the silver nanowires have at least one dimension of less than 100 nm.*

*19. A composition comprising:*
   *a silver salt;*
   *a capping agent,*
   *a chloride additive, the chloride additive being present in the composition in a concentration of 1-500mM, and*
   *a polar solvent capable of reducing the silver salt, wherein a molar ratio of the chloride additive and the silver salt is between about 0.001 and 0.1.*

*20. The composition of claim 19 wherein the silver salt is silver nitrate, silver acetate, or silver perchlorate.*

*21. The composition of claim 19 wherein the polar solvent is ethylene glycol, 1,2-propylene glycol, 1,3-propylene glycol, glycerin, glycerol, or glucose.*

*22. The composition of claim 19 wherein the capping agent is selected from poly(vinyl pyrrolidone), polyacrylamide, polyacrylic and copolymers thereof.*

*23. The composition of claim 19 wherein the molar ratio of the chloride additive and the silver salt is between about 0.005 and 0.1.*

*24. The composition of claim 19 wherein the molar ratio of the chloride additive and the silver salt is between about 0.01 and 0.1.*

*25. The composition of claim 19 further comprising a plurality of silver nanowires, wherein the silver nanowires have at least one dimension of less than 100 nm.*

*26. A composition comprising:*
   *a metal salt having a silver ion;*
   *a capping agent selected from poly(vinyl pyrrolidone), polyacrylamide, polyacrylic and copolymers thereof;*
   *an ionic additive, the ionic additive being present in the composition in a concentration of 1-500mM, and*
   *a polar solvent capable of reducing the metal salt, wherein a molar ratio of the ionic additive and the metal salt is between about 0.001 and 0.1.*

*27. The composition of claim 26 wherein the metal salt is silver nitrate, silver acetate, or silver perchlorate.*

*28. The composition of claim 26 wherein the polar solvent is ethylene glycol, 1,2-propylene glycol, 1,3-propylene glycol, glycerin, glycerol, or glucose.*

*29. The composition of claim 26 wherein the molar ratio of the ionic additive and the silver salt is between about 0.005 and 0.1.*

*30. The composition of claim 26 wherein the molar ratio of the ionic additive and the silver salt is between about 0.01 and 0.1.*

*31. The composition of claim 26 further comprising a plurality of silver nanowires, wherein the silver nanowires have at least one dimension of less than 100 nm.*

*32. The composition of claim 1 wherein the molar ratio of the ionic additive and the metal salt is between about 0.01 and 0.1.*

\* \* \* \* \*